(12) United States Patent
Lee et al.

(10) Patent No.: US 10,535,987 B2
(45) Date of Patent: Jan. 14, 2020

(54) ARC DETECTION APPARATUS USING ELECTRICAL ENERGY

(71) Applicant: KEPID AMSTECH CO., LTD., Gunpo-si (KR)

(72) Inventors: Jun Bae Lee, Seoul (KR); Kyeong Min Hong, Seongnam-si (KR); Jun Hee Cho, Ansan-si (KR)

(73) Assignee: KEPID AMSTECH CO., LTD., Gunpo-si (KR)

( * ) Notice: Subject to any disclaimer, the term of this patent is extended or adjusted under 35 U.S.C. 154(b) by 340 days.

(21) Appl. No.: 15/664,155

(22) Filed: Jul. 31, 2017

(65) Prior Publication Data

US 2018/0062372 A1 Mar. 1, 2018

(30) Foreign Application Priority Data

Aug. 30, 2016 (KR) .................. 10-2016-0110978

(51) Int. Cl.
| | | |
|---|---|---|
| *H02H 1/00* | (2006.01) | |
| *G01R 31/08* | (2006.01) | |
| *G01R 31/12* | (2006.01) | |
| *H02H 3/07* | (2006.01) | |
| *H02H 3/093* | (2006.01) | |

(52) U.S. Cl.
CPC ....... *H02H 1/0015* (2013.01); *G01R 31/1272* (2013.01); *H02H 3/07* (2013.01); *H02H 3/093* (2013.01); *G01R 31/085* (2013.01)

(58) Field of Classification Search
CPC ........ H02H 1/0015; H02H 3/07; H02H 3/093; G01R 31/1272; G01R 31/085
USPC ........................................................ 361/93.4
See application file for complete search history.

(56) References Cited

U.S. PATENT DOCUMENTS

| | | | | |
|---|---|---|---|---|
| 6,459,273 B1* | 10/2002 | Dollar, II | ............. | H02H 1/0015 324/520 |
| 8,189,307 B2 | 5/2012 | Lee et al. | | |
| 2005/0259369 A1* | 11/2005 | Schmalz | ............. | H02H 1/0015 361/5 |
| 2008/0021664 A1* | 1/2008 | Krauss | ............... | G01R 19/0061 702/65 |
| 2014/0278158 A1* | 9/2014 | Miller | .................. | H02H 1/0015 702/58 |

FOREIGN PATENT DOCUMENTS

| | | |
|---|---|---|
| KR | 10-0831338 B1 | 5/2008 |
| KR | 10-0924276 B1 | 10/2009 |
| KR | 10-0956162 B1 | 5/2010 |
| KR | 10-1333648 B1 | 12/2013 |

\* cited by examiner

*Primary Examiner* — Zeev V Kitov
(74) *Attorney, Agent, or Firm* — NSIP Law

(57) ABSTRACT

An arc detection apparatus is provided. The arc detection apparatus detects an arc using an electrical energy, eliminates the possibility of a false arc detection caused by noise due to a power environment, increases accuracy of arc detection, and prevents fires that may occur in a home or an industrial site due to an arc occurrence.

12 Claims, 6 Drawing Sheets

US 10,535,987 B2

ARC DETECTION APPARATUS USING ELECTRICAL ENERGY

CROSS-REFERENCE TO RELATED APPLICATION(S)

This application claims priority from Korean Patent Application No. 10-2016-0110978, filed on Aug. 30, 2016, in the Korean Intellectual Property Office, the disclosure of which is incorporated herein by reference in its entirety.

BACKGROUND

1. Field

The following description relates to a technology which detects an arc in a power line transmitting power, and more particularly, to an arc detection apparatus.

2. Description of Related Art

An arc refers to a type of dielectric breakdown that occurs continuously in a gas between electrodes due to a potential difference generated between the electrodes.

Arcs occur in transmission lines when wires are aged or sheaths of the wires are pressed or picked. In this case, partial disconnection or poor contact occurs, sparks are generated at a portion thereof by a discharge in the air, and a temperature rises instantaneously to 10,000° C. or more. In addition, this causes ignition of combustible materials such as dust and wood in the surroundings and leads to a large fire. As can be seen from a fact that over 80% of domestic and international fires are caused by arcs, a necessity to precisely detect an arc and determine whether an arc has occurred to prevent fire is increasing.

Two types of cut-off method, such as a thermal cut-off method and a magnetic cut-off method, have been used for conventional overcurrent breakers. The thermal cut-off method is a method in which a bimetal is bent by heat generated by an overcurrent and a circuit is cut-off by opening a contact point. The magnetic cut-off method is a method in which a circuit is cut-off by an electromagnetic force generated when a fault current of about ten times a rated current of a circuit flows through the circuit due to a short-circuit current. Therefore, since an arc which occurs due to a current that is lower than or equal to a rated current cannot be detected, an apparatus which detects an arc which occurs due to a current that is lower than or equal to the rated current and cuts-off a circuit is required.

In order to address such a problem, an arc detection apparatus which determines whether an arc has occurred according to the presence or absence of a discontinuous interval due to a gradient of a current detected from a current sensor (CS) installed on a power transmission line has emerged. That is, an apparatus which detects a high-frequency component, which is a characteristic detected when an arc occurs, and determines whether an arc has occurred has emerged. However, an arc detection method used in such an apparatus has a problem in that a false arc detection easily occurs due to power environment characteristics and noise generation.

DOCUMENT OF RELATED ART

Patent Document (Patent Document 1) Korean Registration Patent No. 10-0956162 (registered on Apr. 28, 2010)

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to an arc detection apparatus, in which an instantaneous current, which is an output of a current sensor (CS), is shaped, electrical power calculated by receiving an output signal of the CS, in which the current is shaped, and an output signal of a voltage sensor as inputs is compared to an average of electrical power for a predetermined period, and whether an arc has occurred is determined, thereby eliminating the possibility of a false arc detection caused by noise due to a power environment, increasing accuracy of arc detection, and preventing fires.

In one general aspect, an arc detection apparatus includes a rectifier, a current waveform shaper, an electrical energy calculator, an arc determiner, and an output unit. The rectifier rectifies an output signal of a current sensor (CS). The current waveform shaper compares an output signal of the rectifier to a reference value and shapes a current in a comparison waveform, wherein the output signal is saturated when the output signal is greater than or equal to the reference value and is cut-off when the output signal is less than the reference value. The electrical energy calculator calculates an electrical energy from an output signal of the current waveform shaper and an output signal of a voltage sensor. The arc determiner compares an electrical energy, which is an output of the electrical energy calculator, to a reference electrical energy determined on the basis of an electrical energy for a predetermined period and determines whether an arc has occurred. The output unit receives an electrical signal from the arc determiner when an arc occurs and outputs whether an arc has occurred.

The current waveform shaper may include an amplifier configured to amplify the output signal of the rectifier so as to be saturated.

The electrical energy calculator may further include a first current electrical energy calculator configured to receive the output signal of the current waveform shaper and an instantaneous voltage signal, which is an output of the voltage sensor, as inputs and calculate an electrical energy.

The arc determiner may further include an integrator and a first comparison unit. The integrator may output an electrical energy signal obtained by integrating outputs of a first current electrical energy calculator for a predetermined period. The first comparison unit may output a result signal obtained by comparing the output of the integrator to the output of the first current electrical energy calculator.

The electrical energy calculator may further include a first analog-to-digital (A/D) converter and a second current electrical energy calculator. The first A/D converter may convert an analog current signal, which is an output of the amplifier, into a digital signal. The second current electrical energy calculator may receive an output signal of the first A/D converter and an instantaneous voltage signal, which is an output of the voltage sensor passing through an A/D converter, as inputs and calculate an electrical energy.

Meanwhile, the arc determiner may further include a moving average filter and a second comparison unit. The moving average filter may calculate an average electrical energy during a plurality of cycles by receiving an output signal of the second current electrical energy calculator as an input. The second comparison unit may output a result signal obtained by comparing an output of the moving average filter to an output of the second current electrical energy calculator.

The current waveform shaper may shape the current in the comparison waveform by comparing a preset reference value to a value obtained by over-amplifying the output signal of the rectifier. The current waveform shaper may further include a second A/D converter and a signal processor. The second A/D converter may convert an analog current signal, which is an output of the rectifier, into a digital signal. The signal processor may output a logic value "1" when an output signal of the second A/D converter is greater than or equal to the reference value and output a logic value "0" when the output signal of the second A/D converter is less than the reference value.

Meanwhile, the electrical energy calculator may further include a third electrical energy calculator. The third electrical energy calculator may receive a current signal, which is an output of the current waveform shaper, and an instantaneous voltage signal, which is an output of the voltage sensor passing through an A/D converter, as inputs and calculate an electrical energy.

The arc determiner may further include a moving average filter and a third comparison unit. The moving average filter may calculate an average electrical energy during a plurality of cycles by receiving an output signal of the third electrical energy calculator as an input. The third comparison unit may output a result signal obtained by comparing an output of the moving average filter and an output of the third electrical energy calculator.

The arc detection apparatus may further include a circuit breaker configured to cut an alternating current (AC) power line off from the arc determiner when an arc occurs.

Other features and aspects will be apparent from the following detailed description, the drawings, and the claims.

Figure 1:
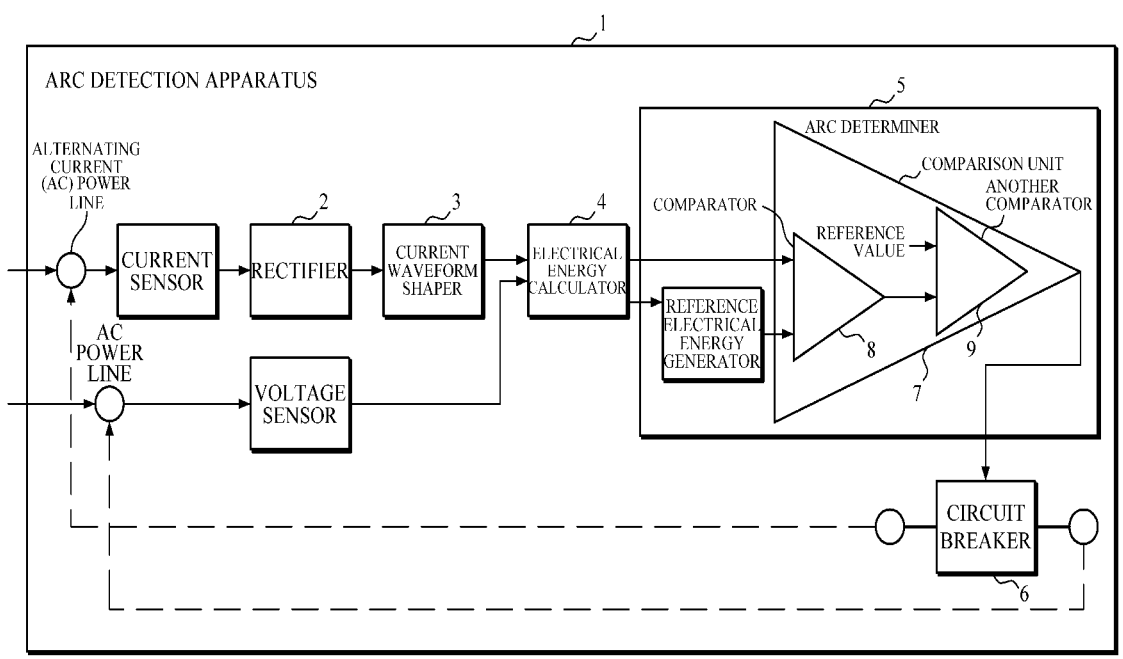
FIG. 1 is a block diagram illustrating a configuration of an arc detection apparatus according to a first embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Hereinafter, arc detection apparatuses 1 according to exemplary embodiments will be described in detail with reference to the accompanying drawings. Here, like reference numerals denote like elements, and repeated description thereof and a detailed description of known functions and configurations that may unnecessarily obscure the gist of the invention will not be repeated. Embodiments of the invention are provided in order to fully explain the invention to those skilled in the art. Therefore, shapes and sizes of elements in the drawings may be exaggerated for a clearer description.

Figure 2:
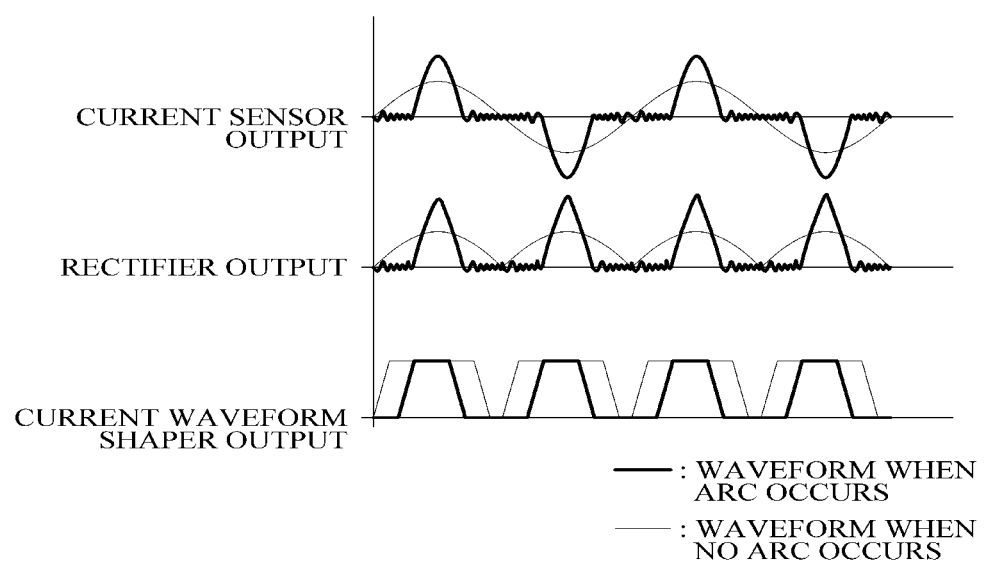
FIG. 2 is a graph illustrating detected waveforms of currents when no arc occurs and detected waveforms of currents when an arc occurs in the arc detection apparatus according to the first embodiment.

FIG. 1 is a block diagram illustrating a configuration of an arc detection apparatus according to a first embodiment. FIG. 2 is a graph illustrating detected waveforms of currents when no arc occurs and detected waveforms of currents when an arc occurs in the arc detection apparatus according to the first embodiment.

As illustrated in FIGS. 1 and 2, an arc detection apparatus 1 according to the first embodiment includes a rectifier 2, a current waveform shaper 3, an electrical energy calculator 4, an arc determiner 5, and an output unit (not shown).

The rectifier 2 rectifies an output signal of a current sensor (CS). As illustrated in FIG. 2, an output of the CS when no arc occurs and an output of the CS when an arc occurs may be compared and checked. That is, when a current in which no arc occurs is detected through the CS, a waveform of the current is in the form of a relatively smooth sine wave. On the other hand, it may be seen that, when a current in which an arc occurs is detected through the CS, a waveform of the current is a waveform in which high-frequency component signals are mixed near a zero crossing.

Meanwhile, according to an aspect, the rectifier 2 may perform full-wave rectification on an output signal of the CS. A full-wave rectifier circuit using an intermediate tap of a transformer may be provided as an example of a full-wave rectifier circuit. A rectifier circuit using a bridge diode may be provided as another example of the full-wave rectifier circuit. According to an aspect, when the rectifier 2 includes the full-wave rectifier circuit, a waveform of an output signal passing through the rectifier 2 may be checked with reference to FIG. 2. That is, as illustrated in FIG. 2, it may be seen that, in a case in which an arc does not occur and in a case in which an arc occurs, a waveform is formed as it is when a current value, which is the output signal of the CS, is greater than or equal to zero and the waveform is inversely formed when the current value is less than zero. Further, according to another aspect, the rectifier 2 may include a half-wave rectifier circuit which outputs a result obtained by performing half-wave rectification on the output signal of the CS.

Also, according to still another aspect, the rectifier 2 may further include a low-pass filter (LPF). For example, the rectifier 2 may include the full-wave rectifier circuit and may generate an output signal by passing a full-wave rectified waveform, which is output by receiving the output signal of the CS as an input, through the LPF as an input. The rectifier 2 may transmit a cleaner waveform in which a high-frequency signal is removed to the current waveform shaper 3, which will be described below, by additionally using the LPF. Accordingly, when the current waveform shaper 3 shapes an input signal, there is an advantage in that a difference between a waveform of a current when an arc occurs and a waveform of a current when no arc occurs is more clearly shown.

The current waveform shaper 3 compares an output signal of the rectifier 2 to a reference value and shapes the current into a comparison waveform in which the output signal is saturated when the output signal is greater than or equal to the reference value and is cut-off when the output signal is less than the reference value. Generally, an arc occurs mainly in a high frequency form due to a distorted current at a phase in the vicinity of a zero crossing of the current. Therefore, the current waveform shaper 3 of the arc detection apparatus 1 according to the first embodiment of the present invention shapes the current using such a characteristic of an arc in order to determine whether an arc has occurred. That is, when an arc occurs, the current waveform shaper 3 may cut-off a distorted current portion in the vicinity of the zero crossing caused by the arc occurrence. Therefore, a result of shaping the signal through the current waveform shaper 3 is an indirect basis for determining whether an arc has occurred in the arc determiner 5, which will be described below. Referring to an output waveform of the current waveform shaper 3 illustrated in FIG. 2, it may be seen that there is a difference between the waveform of the current when no arc occurs and the waveform of the current when an arc occurs. More specifically, it may be seen that there is a difference between saturated periods of the current. Since the electrical energy calculator 4, which will be described below, receives an output of the current waveform shaper 3 as an input and calculates electrical energy, which is a main basis of the determination of an arc in the present invention, whether an arc has occurred, such as the case in which no arc occurs and the case in which an arc occurs, may be determined.

Meanwhile, the reference value may vary according to various aspects of a configuration of the current waveform shaper 3. According to an aspect, the current waveform shaper 3 may include an amplifier 10. According to another aspect, the current waveform shaper 3 may include a Schmidt trigger circuit. The Schmidt trigger circuit is a circuit which is stable in one of two logic states and has a feature in which an output waveform is saturated when an input signal is higher than the reference value and the output waveform is lowered when the input signal is lower than the reference value. According to still another aspect, the current waveform shaper 3 may include an analog-to-digital (A/D) converter and a signal processor which receives an output of the A/D converter as an input and processes a predetermined signal so as to saturate the signal when the signal is a threshold voltage or more and cut-off the signal when the signal is less than the threshold voltage.

The electrical energy calculator 4 calculates an electrical energy from an output signal of the current waveform shaper 3 and an output signal of a voltage sensor. An output of the electrical energy calculator 4 reflects a current electrical energy in an alternating current (AC) power line. Therefore, the arc determiner 5, which will be described below, may receive the current electrical energy, which is the output of the electrical energy calculator 4, as an input, and thus the current electrical energy may be used as an indicator which reflects a current state. According to an aspect, the electrical energy calculator 4 may include a logical AND circuit and may calculate the output signal of the current waveform shaper 3 and the output signal of the voltage sensor by an operation.

The arc determiner 5 compares the electrical energy, which is the output of the electrical energy calculator 4, to a reference electrical energy, which is determined on the basis of an electrical energy for a predetermined period, and determines whether an arc has occurred. Therefore, the arc determiner 5 includes a comparison unit 7 capable of the above comparison. The reference electrical energy, which is determined on the basis of the electrical energy for the predetermined period, refers to an average of time series electrical energy during several preceding cycles including the electrical energy of the electrical energy calculator 4. The arc determiner 5 of the arc detection apparatus 1 according to the first embodiment may calculate the average of time series electrical energy during the several preceding cycles including the electrical energy of the electrical energy calculator 4 according to various aspects. For example, the arc determiner 5 may calculate the average of time series electrical energy during the several preceding cycles including the electrical energy of the electrical energy calculator 4 according to different aspects when the output signal of the electrical energy calculator 4 received as an input of the arc determiner 5 is an analog signal and a digital signal.

According to an aspect, the arc determiner 5 may receive an analog signal, which is the output signal of the electrical energy calculator 4, as an input signal. In this case, the arc determiner 5 may include an integrator 12 which receives the output signal of the electrical energy calculator 4 as an input to calculate an average of time series electrical energy during several preceding cycles including the electrical energy of the electrical energy calculator 4. Also, the arc determiner 5 may further include a comparator 8 which receives the output signal of the electrical energy calculator 4 and an output signal of the integrator 12 as inputs, and may use a result obtained by comparing the two signals as a basis for determining an arc.

According to another aspect, the arc determiner 5 may receive the output signal of the electrical energy calculator 4, which is a digital signal, as an input. In this case the arc determiner 5 may include a moving average filter 23 which receives the output signal of the electrical energy calculator 4 as an input to calculate an average of time series electrical energy during several preceding cycles including the electrical energy of the electrical energy calculator 4. Also, the arc determiner 5 may further include a comparator 8 which receives the output signal of the electrical energy calculator 4 and an output signal of the moving average filter 23 as inputs, and may compare the two signals to determine whether an arc has occurred. Hereinafter, the average of time series electrical energy during the several preceding cycles including the electrical energy of the electrical energy calculator 4 will be referred to as an average electrical energy.

Meanwhile, the reason why the average electrical energy is used as the electrical energy, which is a basis of the determination in the arc determiner 5, is that an electrical energy transmitted in an AC power line may frequently vary according to the supply and demand of power. That is, since the average electrical energy reflects the average of time series electrical energy during several preceding cycles including the current electrical energy, which is a normal trend of the transmission electrical energy which frequently varies, the average electrical energy may represent a trend when no arc occurs. Therefore, since the arc determiner 5 may monitor for arc occurrence in real-time by comparing the average electrical energy to a current electrical energy, the arc determiner 5 may find an abnormal point of arc occurrence and determine whether an arc has occurred.

Further, the arc determiner 5 may further include another comparator 9 which receives an output signal of the above-described comparator 8 and a reference value as inputs. The other comparator 9 may output a logic value "1" when an output of the comparator 8 is greater than or equal to the reference value and output a logic value "0" when the output of the comparator 8 is less than the reference value. The reference value of the arc determiner 5, which is received as an input of the other comparator 9, may be set according to various aspects. According to an aspect, the reference value of the arc determiner 5 may be calculated through a test of generating an arc and detecting the arc. For example, a test result reference value may be set to be 20% of the average electrical energy. More specifically, when a comparison value, which is an output of the other comparator 9, is 20% or more of the average electrical energy, it is determined that an arc occurs and the logic value "1" may be output. When the comparison value is less than 20% of the average electrical energy, a normal state is determined and the logic value "0" may be output.

According to another aspect, the arc determiner 5 may further include a counter which counts the above-described logic values. Based on results of analysis of arc occurrence and detection experiments, when an output of the counter is greater than or equal to a predetermined number, the logic value "1" may be output, and when the output of the counter is less than the predetermined number, the logic value "0" may be output. In this case, the logic value "1" refers to a case in which an arc occurs.

The output unit receives an electrical signal from the arc determiner 5 when an arc occurs and outputs whether an arc has occurred. A method of transmitting a signal, which indicates that an arc has occurred, from the arc determiner 5 to the output unit may be implemented in various aspects using a known technique. According to an aspect, the arc determiner 5 may include a microcomputer and an antenna, and thus may transmit arc occurrence information to the output unit through Wi-Fi. In this case, not only information on whether an arc has occurred but also additional information including a waveform on a time at which the arc occurred, an instantaneous current, an instantaneous voltage, an instantaneous power, and the like may be transmitted. According to another aspect, the arc determiner 5 may be connected to the output unit in a wired manner, and thus may receive the arc occurrence information from the arc determiner 5.

Figure 3:
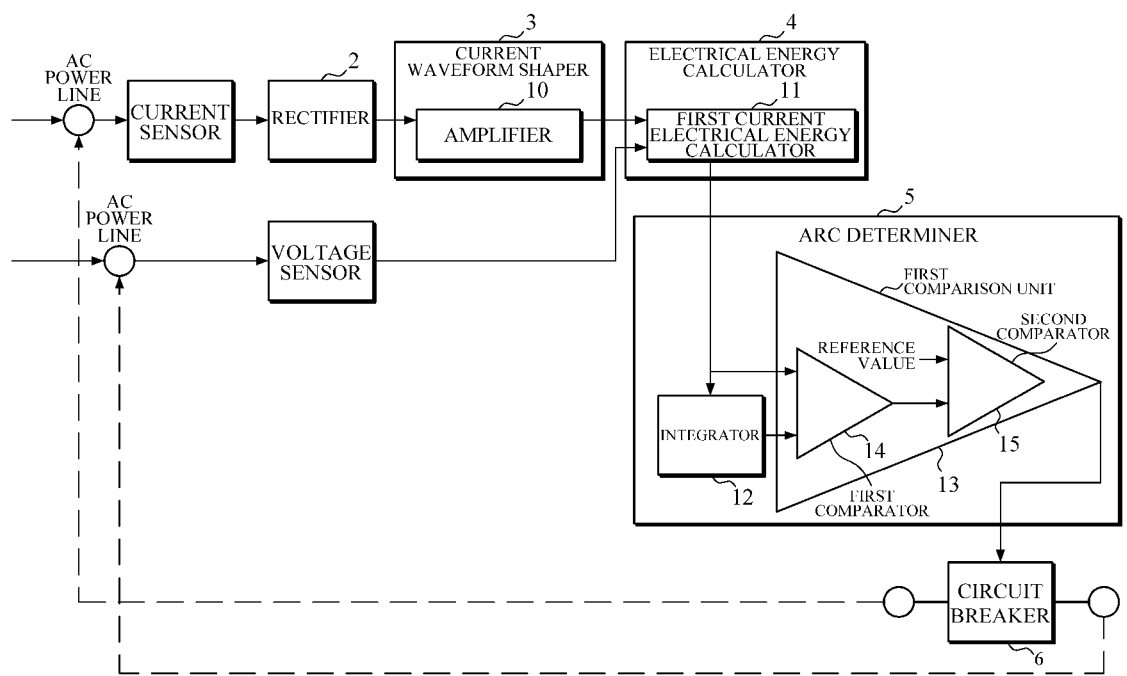
FIG. 3 is a block diagram illustrating a configuration of an arc detection apparatus according to a second embodiment.

FIG. 3 is a block diagram illustrating a configuration of an arc detection apparatus 1 according to a second embodiment. As illustrated in FIG. 3, a current waveform shaper 3 of the arc detection apparatus 1 according to the second embodiment includes an amplifier 10. The amplifier 10 over-amplifies an output signal of a rectifier 2 to be saturated. In this case, the output signal of the rectifier 2 is a rectified analog signal.

Generally, the amplifier 10 does not have perfect linearity like an ideal amplifier. That is, the amplifier 10 has a threshold voltage, and when the threshold voltage is less than or equal to a predetermined value, an input signal may not be amplified and an output of the amplifier 10 is cut-off and becomes 0, and when the threshold voltage is greater than or equal to the predetermined value, a saturation phenomenon in which the output becomes constant occurs. Therefore, the current waveform shaper 3 of the arc detection apparatus 1 according to the second embodiment may over-amplify the output of the rectifier 2 using such a property of the amplifier 10, and thus may shape the current to be in a comparison waveform. As a result, a waveform of a current passing through the current waveform shaper 3 is similar to that of the output signal of the current waveform shaper 3 illustrated in FIG. 2.

Next, an electrical energy calculator 4 of the arc detection apparatus 1 according to the second embodiment further includes a first current electrical energy calculator 11 as illustrated in FIG. 3. The first current electrical energy calculator 11 receives the output signal of the current waveform shaper 3 and an instantaneous voltage signal, which is an output of a voltage sensor, as inputs and calculates an electrical energy. The first current electrical energy calculator 11 receives the output signal of the current waveform shaper 3 of the arc detection apparatus 1 according to the second embodiment and the instantaneous voltage signal, which is the output of the voltage sensor, as inputs and calculates an electrical energy. The calculated electrical energy becomes an input signal of a first comparator 14, which will be described later, of an arc determiner 5 of the arc detection apparatus 1 according to the second embodiment as an indicator of a current electrical energy of a transmission line. In order to facilitate understanding of the description according to different embodiments, the first current electrical energy calculator 11 is different from a second current electrical energy calculator 22 and a third electrical energy calculator 32, which will be described later, in terms of numbering, but does not have other functions.

The arc determiner 5 of the arc detection apparatus 1 according to the second embodiment includes an integrator 12 and a first comparison unit 13 as illustrated in FIG. 3. The integrator 12 integrates an output of the current electrical energy calculator 4 for a determined period and outputs an electrical energy signal. The first comparison unit 13 outputs a result signal obtained by comparing an output of the integrator 12 to an output of the first current electrical energy calculator 11.

The integrator 12 is a type of LPF which receives the output of the first current electrical energy calculator 11 as an input. A desired time constant of the integrator 12 may be made by appropriately selecting the value of a resistor and the capacitance of a condenser, which are components of the integrator 12. As a result, the integrator 12 receives the output of the first current electrical energy calculator 11 as an input and outputs an average value of time series electrical energy for a predetermined period including an electrical energy of the first current electrical energy calculator 11.

According to an aspect, the first comparison unit 13 of the arc determiner 5 may further include a first comparator 14 and a second comparator 15. The first comparator 14 receives the output of the integrator 12 and the output of the first current electrical energy calculator 11 as inputs and calculates an electrical energy difference. The second comparator 15 may receive an output of the first comparator 14 and a reference value as inputs and output whether an arc has occurred as a logic value "1" or a logic value "0." Since a specific example of a process of outputting an arc occurrence signal of the arc determiner 5 according to the reference value has been described in the first embodiment, a description thereof will be omitted. That is, the first comparator 14 may be described in correspondence to the comparator 8 and the second comparator 15 may be described in correspondence to the other comparator 9. Also, the arc determiner 5 transmits an output value of the second comparator 15 to an output unit.

Figure 4:
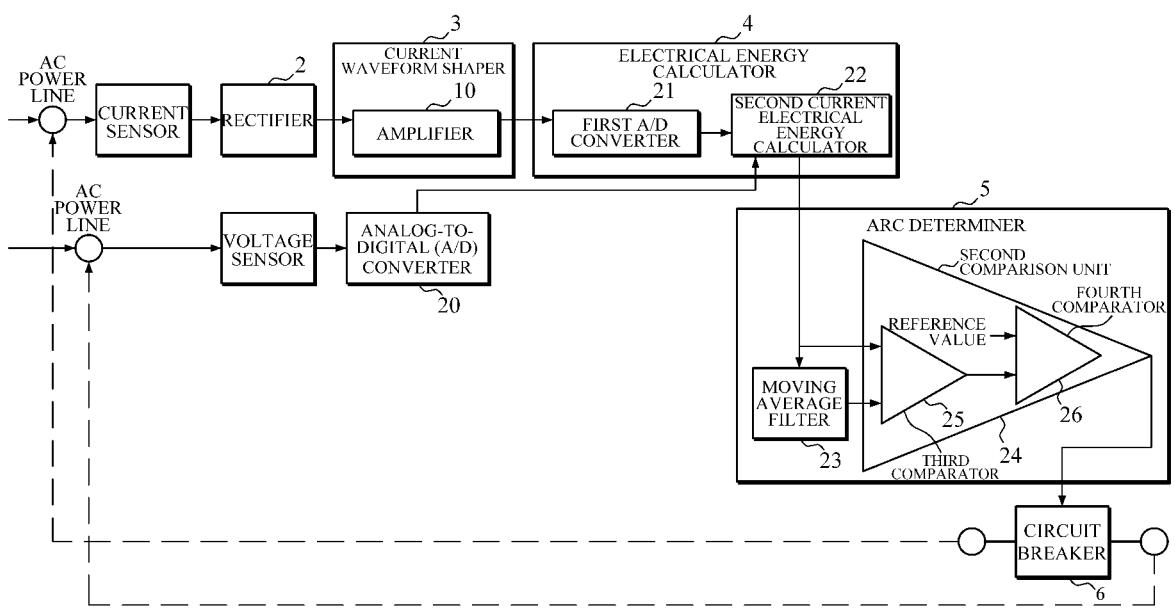
FIG. 4 is a block diagram illustrating a configuration of an arc detection apparatus according to a third embodiment.
Figure 5:
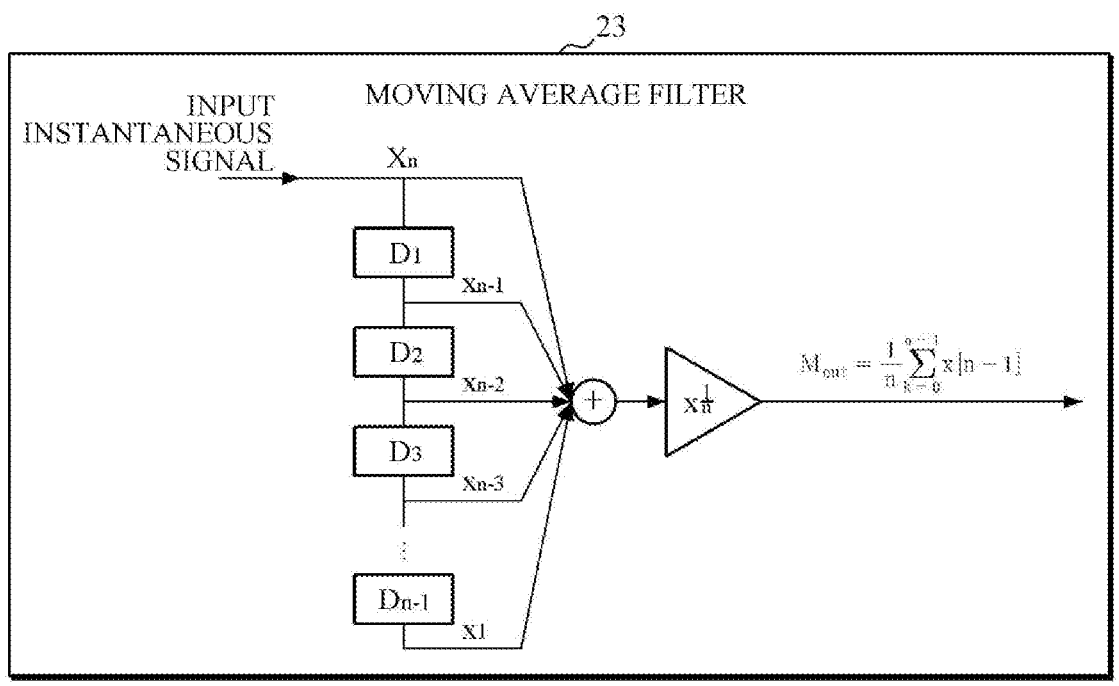
FIG. 5 is a diagram illustrating a moving average filter of an arc determiner of the arc detection apparatus according to the third embodiment.

FIG. 4 is a block diagram illustrating a configuration of an arc detection apparatus 1 according to a third embodiment. FIG. 5 is a diagram illustrating a moving average filter 23 of an arc determiner 5 of the arc detection apparatus 1 according to the third embodiment.

As illustrated in FIG. 4, an electrical energy calculator 4 of the arc detection apparatus 1 according to the third embodiment further includes a first A/D converter 21 and a second current electrical energy calculator 22. The first A/D converter 21 converts an analog current signal, which is an output of an amplifier 10, into a digital signal. The second current electrical energy calculator 22 receives an output signal of the first A/D converter 21 and an instantaneous voltage signal, which is an output of a voltage sensor passing through an A/D converter 20, as inputs and calculates an electrical energy. A difference between the electrical energy calculator 4 of the arc detection apparatus 1 according to the third embodiment, which further includes the first A/D converter 21 and the second current electrical energy calculator 22, and the electrical energy calculator 4 according to the second embodiment is that the electrical energy calculator 4 according to the third embodiment may generate a digital signal for use in the moving average filter 23, which will be described later.

The arc determiner 5 of the arc detection apparatus 1 according to the third embodiment further includes the moving average filter 23 and a second comparison unit 24 as illustrated in FIGS. 4 and 5. The moving average filter 23 calculates an average electrical energy during a plurality of cycles by receiving an output signal of the second current electrical energy calculator 22 as an input. The second comparison unit 24 outputs a result signal obtained by comparing an output of the moving average filter 23 to an output of the second current electrical energy calculator 22. In order to facilitate understanding of the description according to different embodiments, the second comparison unit 24 is different from the above-described comparison unit, the first comparison unit 13, and the third comparison unit 33, which will be described later, in terms of numbering, but does not have any other function. The reason for the different numbering of the comparator, which will be described later, is the same for each embodiment.

An input and output of the moving average filter 23 of the arc determiner 5 of the arc detection apparatus 1 according to the third embodiment will be described with reference to FIG. 5. The moving average filter 23 may include a series of paths, a logical OR circuit, and a logical AND circuit. The path may be a logical block which delays by a predetermined time such as t, and may be represented by delay (D). A series of paths may be numbered to facilitate understanding. That is, as illustrated in FIG. 5, when an input of the moving average filter 23 is set to x[n], x[n] is numbered sequentially in the order of passing paths and may be represented by D1 to Dn.

An input, input processing, and output of the moving average filter 23 will be described as follows. The moving average filter 23 may include n paths in a configuration thereof in accordance with a purpose thereof according to various aspects. When x[n], which corresponds to a second current electrical energy, is input to the moving average filter 23, x[n], x[n−1], which is a signal of x[n] "t" seconds before and delayed by t by passing D1, x[n−2], which is a signal of x[n−1] "t" seconds before and delayed by t by passing D2, and x[1], which is calculated in the same manner, are included as inputs of the logical OR circuit of the moving average filter 23. As a result, the logical OR circuit calculates the sum of the inputs of the above-described logical OR circuit as an output. Next, the logical AND circuit receives the output of the logical OR circuit as an input and multiplies a value of the input by a reciprocal of the number of inputs, that is, 1/n. Thus, the moving average filter 23 may calculate (x[n]+x[n−1]+x[n−2]+ . . . +x[1])/n, which is an average value of the electrical energy during several preceding cycles including the output signal of the second electrical energy calculator 22.

Meanwhile, according to an aspect, the second comparison unit 24 of the arc determiner 5 may further include a third comparator 25 and a fourth comparator 26. The third comparator 25 receives the output of the moving average filter 23 and the output of the second current electrical energy calculator 22 as inputs and calculates an electrical energy difference value. The fourth comparator 26 may receive an output of the third comparator 25 and a reference value as inputs and output whether an arc has occurred as a logic value "1" or a logic value "0." Since a specific example of a process of outputting an arc occurrence signal of the arc determiner 5 according to the reference value has been described in the first embodiment, a description thereof will be omitted. That is, the third comparator 25 may be described in correspondence to the comparator 8 and the fourth comparator 26 may be described in correspondence to the other comparator 9. Also, the arc determiner 5 may transmit an output value of the fourth comparator 26 to an output unit.

Figure 6:
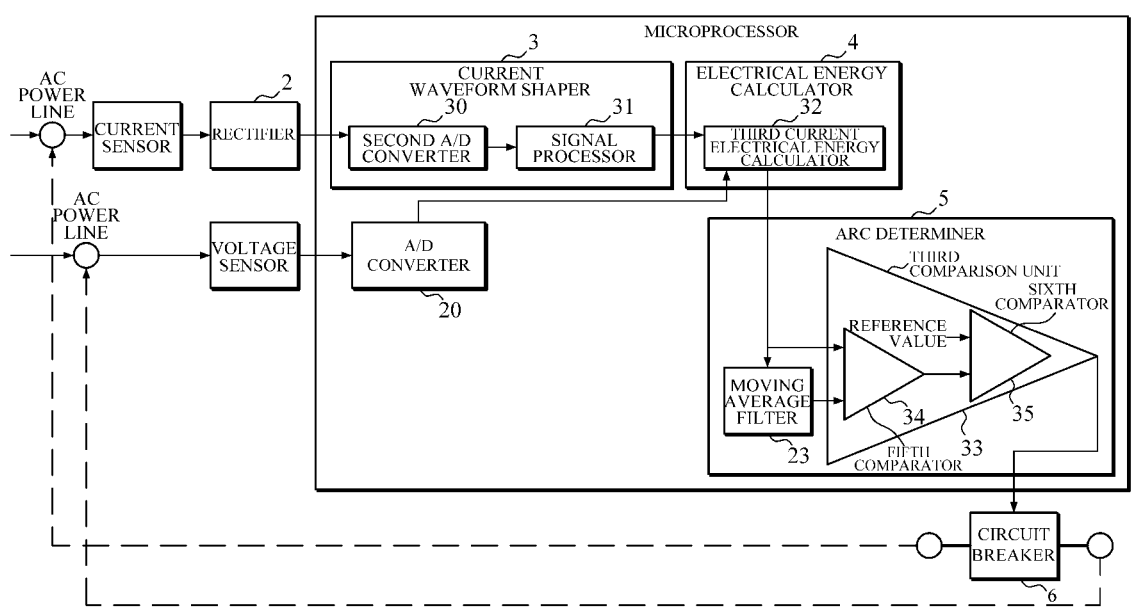
FIG. 6 is a block diagram illustrating a configuration of an arc detection apparatus according to a fourth embodiment.

FIG. 6 is a block diagram illustrating a configuration of an arc detection apparatus according to a fourth embodiment. As illustrated in FIG. 6, a current waveform shaper 3, which shapes a current in a comparison waveform by comparing a value obtained by over-amplifying an output signal of a rectifier 2 to a preset reference value, further includes a second A/D converter 30 and a signal processor 31. The second A/D converter 30 converts an analog current signal, which is an output of the rectifier 2, into a digital signal. The signal processor 31 outputs a logic value "1" when an output signal of the second A/D converter 30 is greater than or equal to a reference value and outputs a logic value "0" when the output signal of the second A/D converter 30 is less than the reference value.

The signal processor 31 receives a digital signal, which is an output of the second A/D converter 30, as an input. The signal processor 31 compares an input signal of the signal processor 31 to the reference value. The signal processor 31 saturates the signal with a value corresponding to the logic value "1" when the input signal of the signal processor 31 is greater than or equal to the reference value. The signal processor 31 cuts-off the signal with the logic value "0" when the input signal of the signal processor 31 is less than the reference value.

The signal processor 31 of the current waveform shaper 3 of the arc detection apparatus 1 according to the fourth embodiment may implement such logic according to various aspects. According to an aspect, the signal processor 31 may include a Schmidt trigger circuit. The Schmidt trigger circuit receives the output of the second A/D converter 30 as an input. The Schmidt trigger circuit is operated to saturate an output waveform to a value corresponding to the logic value "1" when an input signal is higher than a preset reference value, and is operated to cut-off the output waveform to a value corresponding to the logic value "0" when the input signal is less than the preset reference value.

According to another aspect, the signal processor 31 may be implemented by using a microprocessor. When a current waveform is shaped, the arc detection apparatus 1 according to the fourth embodiment may be implemented in software unlike the arc detection apparatuses 1 according to the first and second embodiments. For example, the arc detection apparatus 1 according to the fourth embodiment may be programmed by setting a condition so as to output the logic value "1" when the output of the second A/D converter 30 is greater than or equal to the preset reference value and output the logic value "0" when the output of the second A/D converter 30 is less than the preset reference value.

As illustrated in FIG. 6, an electrical energy calculator 4 of the arc detection apparatus 1 according to the fourth embodiment may further include a third electrical energy calculator 32. The third electrical energy calculator 32 receives a current signal, which is an output of the current waveform shaper 3, and an instantaneous voltage signal, which is an output of a voltage sensor passing through an A/D converter 20, as inputs and calculates an electrical energy. According to an aspect, the third electrical energy calculator 32 may include a logical AND circuit of a microprocessor. According to another aspect, the third electrical energy calculator 32 may simultaneously calculate an instantaneous electrical energy and store instantaneous electrical energy information in an array form. The instantaneous electrical energy information stored in an array form may be transmitted as an input of a moving average filter 23 of an arc determiner 5, which will be described later, or as an input of a sequential logic circuit in another configuration.

As illustrated in FIG. 6, the arc determiner 5 of the arc detection apparatus 1 according to the fourth embodiment may further include the moving average filter 23 and a third comparison unit 33. The moving average filter 23 calculates an average electrical energy during a plurality of cycles by receiving an output signal of the third electrical energy calculator 32 as an input. The third comparison unit 33 outputs a result signal obtained by comparing an output of the moving average filter 23 to an output of the current electrical energy calculator 4.

Since characteristics of the moving average filter 23 have been described by the description of the arc determiner 5 of the arc detection apparatus 1 according to the third embodiment, a description thereof will be omitted. The moving average filter 23 may have the plurality of the above-described paths and other logic circuits using a known technology, and thus may calculate an average of signals during several preceding cycles including the output signal of the third electrical energy calculator 32. According to still another aspect, a component which replaces the moving average filter 23 of the arc determiner 5 of the arc detection apparatus 1 according to the fourth embodiment and has the same function as the moving average filter 23 may be implemented using a microprocessor. For example, according to another aspect, the third electrical energy calculator 32 of the electrical energy calculator 4 of the arc detection apparatus 1 according to the fourth embodiment may simultaneously calculate an instantaneous electrical energy and store instantaneous electrical energy information in an array form. In this case, the arc determiner 5 may be implemented using a microprocessor. The arc determiner 5 may receive a register array value corresponding to an electrical energy during a plurality of consecutive cycles as an input of a calculator by repeatedly using an appropriate clock frequency provided by the microprocessor, and calculate an average value.

Meanwhile, according to an aspect, the third comparison unit 33 may further include a fifth comparator 34 and a sixth comparator 35. The fifth comparator 34 receives the output of the moving average filter 23 and an output of the third electrical energy calculator 32 as inputs and calculates an electrical difference energy value. The sixth comparator 35 may receive an output of the fifth comparator 34 and a reference value as inputs and output whether an arc has occurred as the logic value "1" or the logic value "0." Since a specific example has been described as an example in the first embodiment, a description thereof will be omitted. Since a specific example of a process of outputting an arc occurrence signal of the arc determiner 5 according to the reference value has been described in the first embodiment, a description thereof will be omitted. That is, the fifth comparator 34 may be described in correspondence to the comparator 8 and the sixth comparator 35 may be described in correspondence to another comparator 9. Also, the arc determiner 5 may transmit an output value of the sixth comparator 35 to an output unit.

Meanwhile, characteristics of the arc detection apparatus 1 according to the fourth embodiment may be described in terms of the type of signal transmitted according to a sequential flow of the block diagram illustrated in FIG. 6. In short, the arc detection apparatus 1 according to the fourth embodiment has a characteristic in which all signals which are input, processed, and output from the output signal of the current waveform shaper 3 are digital signals. The arc detection apparatus 1 may increase utilization of a microprocessor using such a characteristic. That is, the arc detection apparatus 1 may process more useful information by using the microprocessor, and may be programmed to output desired information to the output unit in accordance with an intention. For example, the arc detection apparatus 1 may output waveforms of an instantaneous current, an instantaneous voltage, and an instantaneous power, and thus may monitor a state in which AC power is transmitted through an electric power line in real time. In addition, the arc determiner 5 may more precisely set a condition, which is a basis for determining the arc, to increase accuracy of arc detection.

As illustrated in FIGS. 1, 3, 4, and 6, the arc detection apparatus 1 according to the first embodiment of the present invention may further include a circuit breaker 6 which cuts an AC power line off from the arc determiner 5 when an arc occurs. The circuit breaker 6 may receive an output of the arc determiner 5 as an input and cut-off the AC power line. For example, the circuit breaker 6 may cut-off the AC power line when the output of the arc determiner 5 is the logic value "1" and may not cut-off the AC power line when the output of the arc determiner 5 is the logic value "0," and vice versa. As described above, a method and process of the circuit breaker 6 recognizing whether an arc has occurred by receiving an output of the arc determiner 5 as an input may vary according to a logical configuration of the arc determiner 5 and the circuit breaker 6. For example, a logic circuit in which the arc determiner 5 outputs the logic value "1" when an arc occurs and outputs the logic value "0" when no arc occurs may be configured. In this case, a logic in which the circuit breaker 6 cuts-off an AC circuit when the logic value "1," which is the output of the arc determiner 5, is received as an input and does not cut-off the AC circuit when the logic value "0" is received may be configured.

The circuit breaker 6 may be configured using a known technology. According to an aspect, the circuit breaker 6 may receive the output of the arc determiner 5 as a trip signal of the circuit breaker 6, and cut-off the AC circuit by exciting a trip coil of the circuit breaker 6 or disconnecting and cutting-off an exciter.

In addition, the circuit breaker 6 may further include a breaker having a breaking function such as a thermal cut-off method and a magnetic cut-off method. Since the arc detection apparatus 1 according to the first embodiment of the present invention are driven by power, an exceptional situation in a case in which a problem occurs before a power line is installed indoors or during a power failure may be prepared for by using the arc detection apparatuses 1. The occurrence of the problem refers to a sheath of wires being pressed or picked, partial disconnection, or poor contact.

According to another aspect, the arc detection apparatus 1 may further include a circuit breaker 6, which cuts the AC power line off from the arc determiner 5 when an arc has occurred, and reconnects the AC power line to the arc determiner 5 after a predetermined time. In a second embodiment according to this aspect, the circuit breaker 6 includes a timer, which starts a counter when a signal is output from the arc determiner 5, therein and operates to reconnect the AC power line to the arc determiner 5 after a predetermined time.

According to still another aspect, the arc detection apparatus 1 may further include a circuit breaker 6, which cuts an AC power line off from the arc determiner 5 when an arc has occurred, and reconnects the AC power line to the arc determiner 5 after a predetermined time, wherein the circuit breaker 6 may maintain the cut-off state without the reconnection of the AC power line after the cut-off and reconnection are repeated a predetermined number or more of times within a predetermined time. In a third embodiment according to this aspect, for example, the circuit breaker 6 may include a first timer, a second timer, and a counter therein. The first timer starts the counter when the arc determiner 5 outputs a cut-off signal. The counter counts time-out events of the first timer and outputs the events when it reaches a predetermined number. The second timer counts a time, for which the counter operates, and resets the counter when a set time has elapsed. When the events are output from the counter, the circuit breaker 6 reconnects the AC power line to the arc determiner 5.

According to the present invention, an arc is detected by using an electrical energy, and thus the possibility of a false arc detection caused by noise due to a power environment can be eliminated. Therefore, since accuracy of arc detection can be increased, fires that may occur in a home or an industrial site due to an arc occurrence can be prevented.

Meanwhile, while representative embodiments of the preset invention have been described above in detail, it should be understood by those skilled in the art that the embodiments may be variously modified without departing from the scope of the present invention. Therefore, the scope of the present invention is defined not by the described embodiment but by the appended claims, and encompasses equivalents that fall within the scope of the appended claims.

The current embodiments can be implemented as computer readable codes in a computer readable record medium. Codes and code segments constituting the computer program can be easily inferred by a skilled computer programmer in the art. The computer readable record medium includes all types of record media in which computer readable data are stored. Examples of the computer readable record medium include a ROM, a RAM, a CD-ROM, a magnetic tape, a floppy disk, and an optical data storage. Further, the record medium may be implemented in the form of a carrier wave such as Internet transmission. In addition, the computer readable record medium may be distributed to computer systems over a network, in which computer readable codes may be stored and executed in a distributed manner.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

INDUSTRIAL APPLICABILITY

The preset invention may be used industrially in a technical field in which an arc is detected

What is claimed is:

1. An arc detection apparatus comprising:
   a rectifier configured to rectify an output signal of a current sensor (CS);
   a current waveform shaper configured to compare an output signal of the rectifier to a reference value and shape a current in a comparison waveform, wherein the output signal is saturated when the output signal is greater than or equal to the reference value and is cut-off when the output signal is less than the reference value;
   an electrical energy calculator configured to calculate an electrical energy from an output signal of the current waveform shaper and an output signal of a voltage sensor;
   an arc determiner configured to compare an electrical energy, which is an output of the electrical energy calculator, to a reference electrical energy determined on the basis of an electrical energy for a predetermined period and determine whether an arc has occurred; and
   an output unit configured to receive an electrical signal from the arc determiner when an arc occurs and output whether an arc has occurred.

2. The arc detection apparatus of claim 1, wherein the current waveform shaper includes an amplifier configured to amplify the output signal of the rectifier to be saturated.

3. The arc detection apparatus of claim 2, wherein the electrical energy calculator further includes a first current electrical energy calculator configured to receive the output signal of the current waveform shaper and an instantaneous voltage signal, which is an output of the voltage sensor, as inputs and calculate an electrical energy.

4. The arc detection apparatus of claim 3, wherein the arc determiner further includes:
   an integrator configured to output an electrical energy signal obtained by integrating outputs of a first current electrical energy calculator for a predetermined period; and
   a first comparison unit configured to output a result signal obtained by comparing the output of the integrator to the output of the first current electrical energy calculator.

5. The arc detection apparatus of claim 2, wherein the electrical energy calculator further includes:
   a first analog-to-digital (A/D) converter configured to convert an analog current signal, which is an output of the amplifier, into a digital signal; and
   a second current electrical energy calculator configured to receive an output signal of the first A/D converter and an instantaneous voltage signal, which is an output of the voltage sensor passing through the first A/D converter, and calculate an electrical energy.

6. The arc detection apparatus of claim 5, wherein the arc determiner further includes:
   a moving average filter configured to calculate an average electrical energy during a plurality of cycles by receiving an output signal of the second current electrical energy calculator as an input; and a second comparison unit configured to output a result signal obtained by comparing an output of the moving average filter to an output of the second current electrical energy calculator.

7. The arc detection apparatus of claim 1, wherein the current waveform shaper, which shapes the current in the comparison waveform by comparing a preset reference value to a value obtained by over-amplifying the output signal of the rectifier, further includes:

a second A/D converter configured to convert an analog current signal which, is an output of the rectifier, into a digital signal; and a signal processor configured to output a logic value "1" when an output signal of the second A/D converter is greater than or equal to the reference value and output a logic value "0" when the output signal of the second A/D converter is less than the reference value.

8. The arc detection apparatus of claim 7, wherein the electrical energy calculator further includes a third electrical energy calculator configured to receive a current signal, which is an output of the current waveform shaper, and an instantaneous voltage signal, which is an output of the voltage sensor passing through an A/D converter, and calculate an electrical energy.

9. The arc detection apparatus of claim 8, wherein the arc determiner further includes:

a moving average filter configured to calculate an average electrical energy during a plurality of cycles by receiving an output signal of the third electrical energy calculator as an input; and a third comparison unit configured to output a result signal obtained by comparing an output of the moving average filter and an output of the third electrical energy calculator.

10. The arc detection apparatus of claim 1, further comprising a circuit breaker configured to cut an alternating current (AC) power line off from the arc determiner when an arc occurs.

11. The arc detection apparatus of claim 1, further comprising a circuit breaker configured to cut an AC power line off from the arc determiner when an arc has occurred and reconnect the AC power line to the arc determiner after a predetermined time.

12. The arc detection apparatus of claim 1, further comprising a circuit breaker configured to cut an AC power line off from the arc determiner when an arc has occurred and reconnect the AC power line to the arc determiner after a predetermined time, wherein the circuit breaker maintains the cut-off state without the reconnection of the AC power line after the cut-off and reconnection are repeated a predetermined number or more of times within a predetermined time.

* * * * *